(12) United States Patent
Zhao et al.

(10) Patent No.: US 12,087,352 B2
(45) Date of Patent: Sep. 10, 2024

(54) TECHNIQUES TO COUPLE HIGH BANDWIDTH MEMORY DEVICE ON SILICON SUBSTRATE AND PACKAGE SUBSTRATE

(71) Applicant: Tahoe Research, Ltd., Dublin (IE)

(72) Inventors: Chong J. Zhao, West Linn, OR (US); James A. McCall, Portland, OR (US); Shigeki Tomishima, Portland, OR (US); George Vergis, Portland, OR (US); Kuljit S. Bains, Olympia, WA (US)

(73) Assignee: Tahoe Research, Ltd., Dublin (IE)

( * ) Notice: Subject to any disclaimer, the term of this patent is extended or adjusted under 35 U.S.C. 154(b) by 0 days.

(21) Appl. No.: 18/479,330

(22) Filed: Oct. 2, 2023

(65) Prior Publication Data
US 2024/0029785 A1     Jan. 25, 2024

Related U.S. Application Data

(60) Continuation of application No. 18/153,183, filed on Jan. 11, 2023, now Pat. No. 11,776,619, which is a continuation of application No. 17/368,732, filed on Jul. 6, 2021, now Pat. No. 11,557,333, which is a division of application No. 16/737,666, filed on Jan. 8, 2020, now Pat. No. 11,056,179.

(51) Int. Cl.
| | |
|---|---|
| G11C 29/02 | (2006.01) |
| G11C 11/408 | (2006.01) |
| G11C 11/4093 | (2006.01) |
| G11C 11/4096 | (2006.01) |
| H10B 12/00 | (2023.01) |

(52) U.S. Cl.
CPC ........ *G11C 11/4093* (2013.01); *G11C 11/408* (2013.01); *G11C 11/4096* (2013.01); *H10B 12/00* (2023.02); *G11C 29/02* (2013.01)

(58) Field of Classification Search
CPC ...................................................... G11C 29/02
See application file for complete search history.

(56) References Cited

U.S. PATENT DOCUMENTS

| | | | | |
|---|---|---|---|---|
| 6,320,805 | B1 * | 11/2001 | Yamaoka | G11C 29/50 365/201 |
| 9,432,298 | B1 | 8/2016 | Smith | |
| 2014/0328104 | A1 | 11/2014 | Jeon et al. | |

OTHER PUBLICATIONS

Notice of Allowance for U.S. Appl. No. 16/737,666, Mailed Mar. 3, 2021, 9 pages.
Restriction Requirement for U.S. Appl. No. 16/737,666, Mailed Dec. 16, 2020, 6 pages.
Indian Examination Report for Indian Patent Application No. 202044039195, Mailed Jun. 1, 2022, 7 pages.

* cited by examiner

*Primary Examiner* — Jason Lappas
(74) *Attorney, Agent, or Firm* — Studebaker & Brackett PC

(57) ABSTRACT

Techniques to couple a high bandwidth memory device on a silicon substrate and a package substrate are disclosed. Examples include selectively activating input/out (I/O) or command and address (CA) contacts on a bottom side of a logic layer for the high bandwidth device based on a mode of operation. The I/O and CA contacts are for accessing one or more memory devices include in the high bandwidth memory device via one or more data channels.

18 Claims, 16 Drawing Sheets

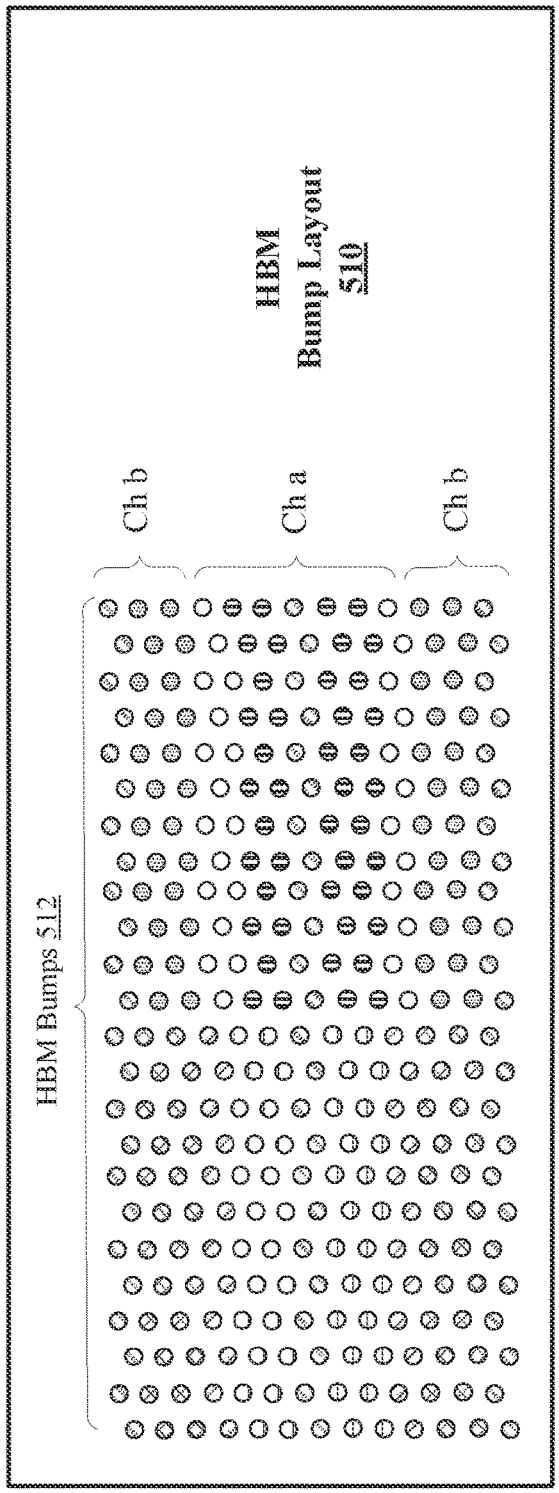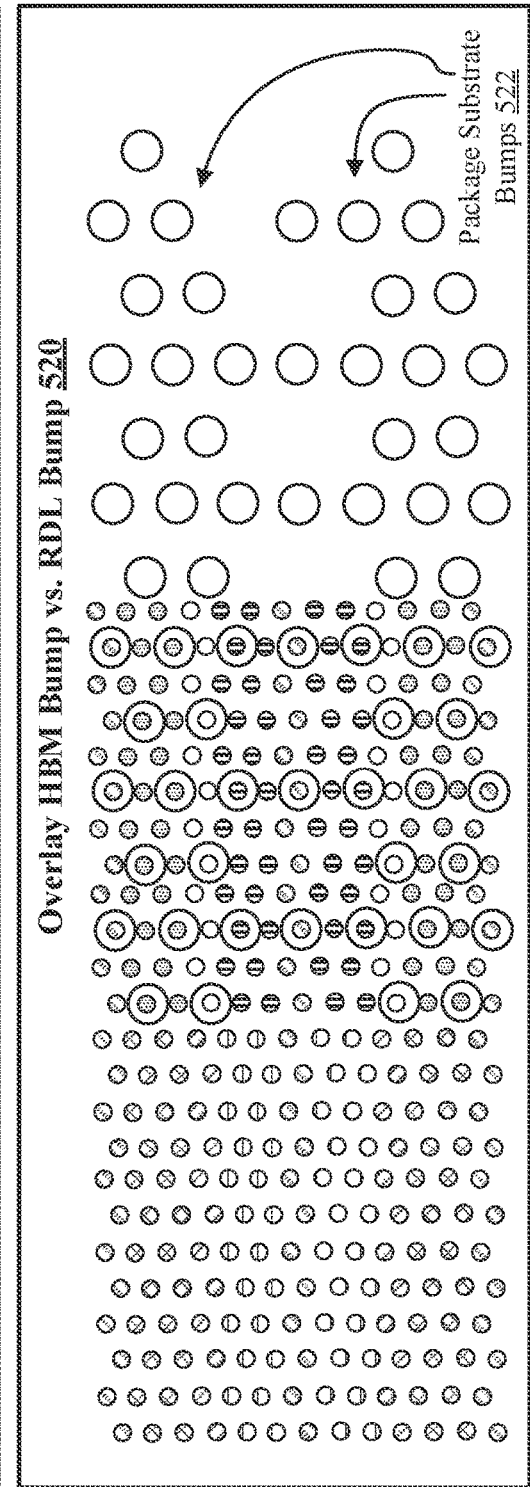
FIG. 5

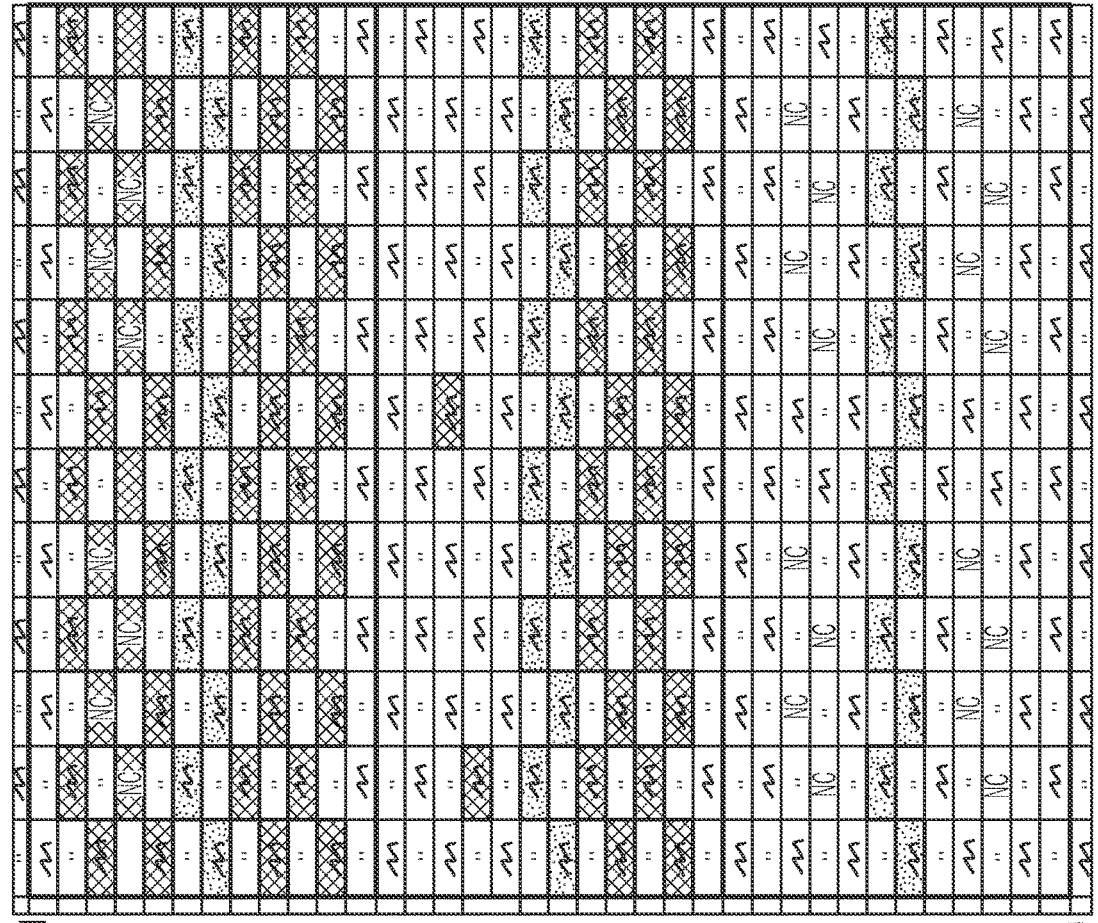
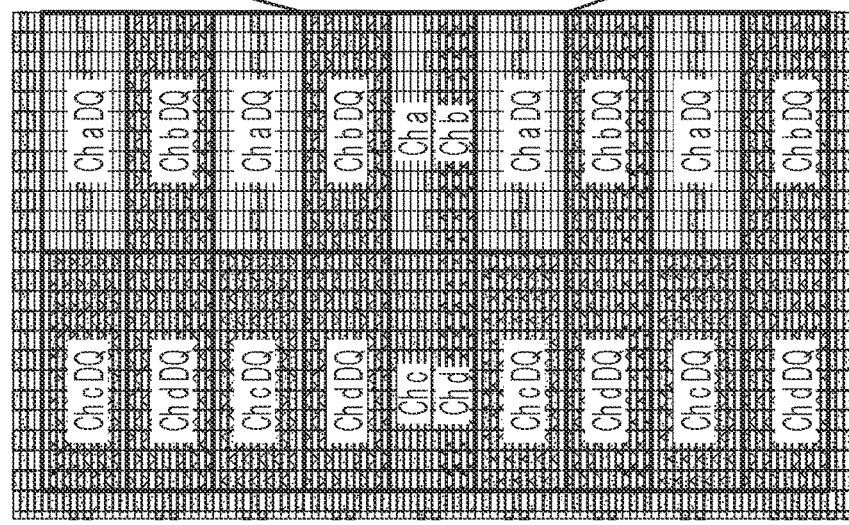
FIG. 8

FLOW 900

1100

```
DETERMINE, VIA A MODE REGISTER, A MODE OF OPERATION FOR AN
HIGH BANDWIDTH MEMORY STACK DEVICE INCLUDE A PLURALITY OF
MEMORY DEVICES STACKED ABOVE A LOGIC LAYER
1102
```

```
CAUSE, BASED ON THE DETERMINED MODE OF OPERATION, A
PORTION OF I/O CONTACTS ON A BOTTOM SIDE OF THE LOGIC LAYER
TO BE ACTIVE AND A REMAINING PORTION OF THE I/O CONTACTS TO
BE INACTIVE, THE PORTION OF I/O CONTACTS ARRANGED TO RECEIVE
OR TRANSMIT I/O SIGNALS FOR ONE OR MORE DATA CHANNELS TO
ACCESS THE PLURALITY OF MEMORY DEVICES
1104
```

```
CAUSE I/O SIGNALS TO BE ROUTED VIA THE ONE OR MORE DATA
CHANNELS THROUGH THE PORTION OF I/O CONTACTS SUCH THAT A
REDIRECTION LAYER BELOW THE LOGIC LAYER ENABLES THE HIGH
BANDWIDTH MEMORY STACK DEVICE TO CONNECT WITH A PACKAGE
SUBSTRATE THROUGH A REDUCED NUMBER OF I/O CONTACTS
1106
```

*FIG. 11*

*Storage Medium 1200*

*Computer Executable Instructions for 1100*

FIG. 12

TECHNIQUES TO COUPLE HIGH BANDWIDTH MEMORY DEVICE ON SILICON SUBSTRATE AND PACKAGE SUBSTRATE

CROSS-REFERENCE TO RELATED APPLICATIONS

This application is a Continuation of U.S. patent application Ser. No. 18/153,183 filed Jan. 11, 2023, which is a Continuation of U.S. patent application Ser. No. 17/368,732 filed Jul. 6, 2021, issued as U.S. Pat. No. 11,557,333 on Jan. 17, 2023, which is a Divisional of U.S. patent application Ser. No. 16/737,666 filed Jan. 8, 2020, issued as U.S. Pat. No. 11,056,179 on Jul. 6, 2021, the entire contents of which are incorporated herein by reference.

TECHNICAL FIELD

Examples described herein are generally related to high bandwidth memory.

BACKGROUND

In computing systems such as a system on chip (SOC) or system in package (SiP), to provide memory with additional density to support various computing operations, memory devices having a plurality of closely coupled memory elements or arrays are being developed and deployed. These types of memory devices may be referred to as three-dimensional (3D) stacked memory or stacked memory. A common characterization of these types of stacked memory is high bandwidth memory.

A common deployment of high bandwidth memory may include stacked layers or dies of dynamic random-access memory (DRAM) that may be referred to as a high bandwidth memory stack device or high bandwidth memory pack device. A high bandwidth memory stack or pack device may be utilized to provide a large amount of computer or system memory in a single package on a package substrate. The package may also include components such as a memory controller, a central processing unit (CPU), graphics processing unit (GPU) or other components.

BRIEF DESCRIPTION OF THE DRAWINGS

FIG. 5 illustrates an example redistribution layout scheme.
FIG. 8 illustrates an example second redistribution scheme.
FIG. 11 illustrates an example second logic flow.
FIG. 12 illustrates an example storage medium.

DETAILED DESCRIPTION

In some examples, a high bandwidth memory stack device that includes a stack of four DRAM devices or dice with a logic layer may include around 1,000 input/outputs (I/Os) contacts (e.g., metal bumps) to physically connect with a package substrate that couples, for example, the high bandwidth memory stack device with a CPU and/or GPU. Numerous other contacts for clock (CLK) signaling or command and address (CA) signaling may also have contacts to connect to the package substrate. The large number of I/O, CLK and CA contacts in a relatively small area beneath the high bandwidth memory stack device may result in very tight or small pitches between these contacts. Solutions involving expensive package interconnect technologies may be used to deal with tight pitches between contacts. For example, a silicon interposer or a silicon bridge such as an embedded multi-die interconnect bridge (EMIB) may be a type of solution used to handle tight pitches. An EMIB solution may be able to handle the tight or small pitches of the high bandwidth memory stack device, but the EMIB solution forces a straight line connection between the high bandwidth memory stack device and a CPU or GPU and limits flexibility for package interconnect signal routing. This straight line requirement and lack of flexibility for EMIB may bring placement and die size conflicts to CPUs, GPUs or other types of die packages that may be included on an SOC or SiP. Also, use of just a silicon interposer to address a tight pitch for a high bandwidth memory stack device possibly adds an unacceptable level of cost.

Figure 1:
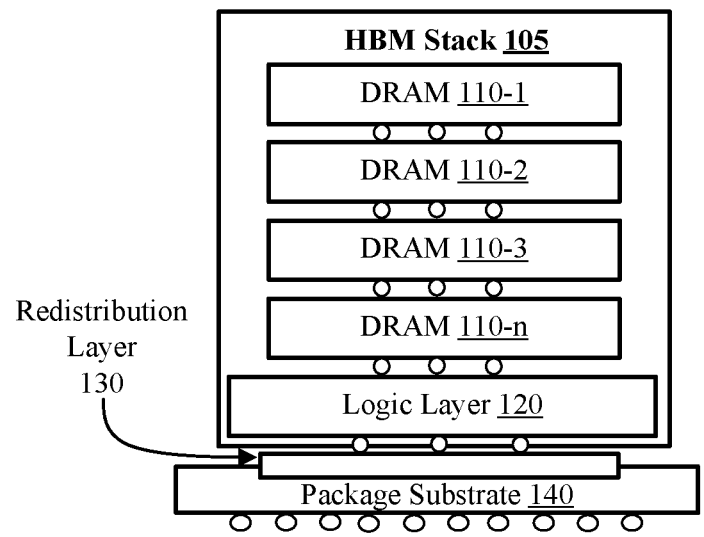
FIG. 1 illustrates an example first system.

FIG. 1 illustrates an example system 100. In some examples, as shown in FIG. 1, system 100 includes a high bandwidth memory (HBM) stack 105 coupled with a package substrate 140 via a redistribution layer 130. In some examples, HBM stack 105 may include multiple layers of memory devices or dies with a bottom or lower logic layer. For example, as shown in FIG. 1, HBM stack 105 includes DRAMs 110-1 to 110-$n$, where "n" represents any positive whole integer >1, stacked on top of a logic layer 120. Logic layer 120 may include circuitry, logic and/or features to facilitate access to/from DRAMs 110-1 to 110-$n$ as well as command and address signals associated with access to DRAMs 110-1 to 110-$n$. DRAMs 110-1 to 110-$n$ may represent separate memory devices each having multiple addressable memory arrays that may be accessed via respective memory channels. Each memory channel may include a large number of I/O signal paths (e.g., 128). As described in more detail below, logic layer 120 may include circuitry, logic and/or features capable of either merging memory channels and/or reducing I/O signal paths in order to reduce a number of active connections on a bottom side of logic layer 120. The merged memory channels and/or reduced I/O signal paths may be routed through the reduced number of active connections on the bottom side of logic layer 120 to connect with package substrate 140 through redistribution layer 130 to couple HBM stack 105, for example, with a CPU or a GPU (not shown). In some examples, redistribution layer 130 may a part of or integrated with package substrate 140. In other examples, redistribution layer 130 may be a separate layer from package substrate 140 that couples or connects between logic layer 120 and package substrate 140.

According to some examples, merging of memory channels and/or I/O signal paths may enable greater flexibility for package interconnect routing through redistribution layer 130. Merging of memory channels and/or I/O signal paths may also reduce problems presented by tight contact pitches for contacts at a lower end or bottom side of logic layer 120. For example, by merging channels and/or I/O signals, as mentioned in more details below, a reduced number of contacts may need to be coupled with package substrate 140 via redistribution layer 130. Reduced contacts enable contact pitches to be increased if contacts are removed from redistribution layer 130. Alternatively, unneeded contacts may be logically or electrically disconnected or not connected. These logically or electrically disconnected contacts may reduce possible signal interference or heat issues in relation to all connections being active.

Examples are not limited to DRAM for memory devices included in an HBM stack 105. Memory devices, as described herein, may refer to non-volatile or volatile memory types. Some non-volatile memory types may be block addressable such as NAND or NOR technologies. Other non-volatile memory types may be byte or block addressable types of non-volatile memory having a 3-dimensional (3-D) cross-point memory structure that includes, but is not limited to, chalcogenide phase change material (e.g., chalcogenide glass) hereinafter referred to as "3-D cross-point memory". Non-volatile types of memory may also include other types of byte or block addressable non-volatile memory such as, but not limited to, multi-threshold level NAND flash memory, NOR flash memory, single or multi-level phase change memory (PCM), resistive memory, nanowire memory, ferroelectric transistor random access memory (FeTRAM), anti-ferroelectric memory, resistive memory including a metal oxide base, an oxygen vacancy base and a conductive bridge random access memory (CB-RAM), a spintronic magnetic junction memory, a magnetic tunneling junction (MTJ) memory, a domain wall (DW) and spin orbit transfer (SOT) memory, a thyristor based memory, a magnetoresistive random access memory (MRAM) that incorporates memristor technology, spin transfer torque MRAM (STT-MRAM), or a combination of any of the above.

Descriptions herein referring to a "RAM" or "RAM device" can apply to any memory device that allows random access, whether volatile or non-volatile. Descriptions referring to a DRAM, or synchronous DRAM (SDRAM), DRAM device or SDRAM device may refer to a volatile random access memory device. The memory device, SDRAM or DRAM may refer to the die itself, to a packaged memory product that includes one or more dies, or both. In some examples, a system with volatile memory that needs to be refreshed may also include at least some non-volatile memory to support at least a minimal level of memory persistence.

Figure 2:
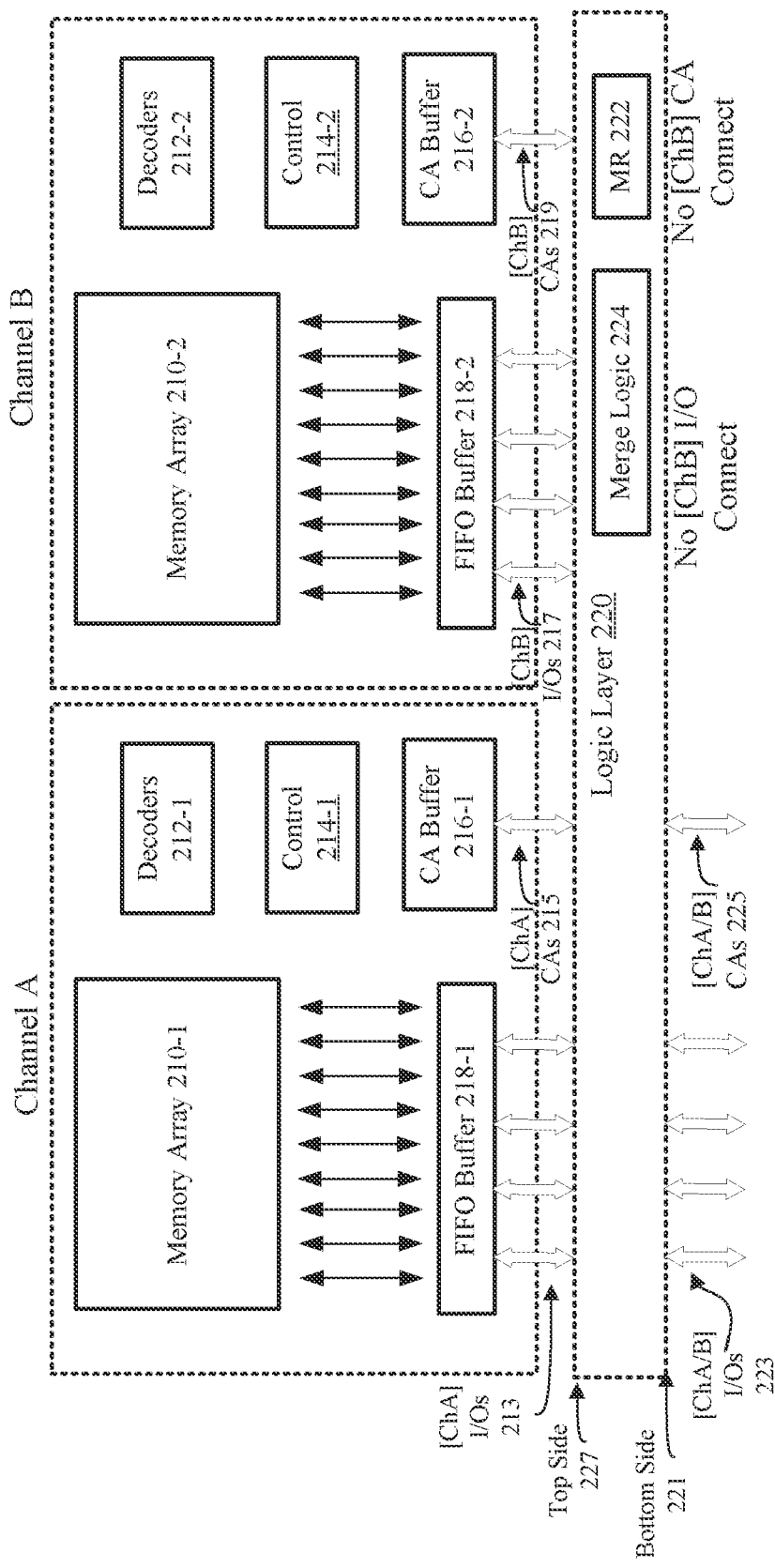
FIG. 2 illustrates an example first sub-system.

FIG. 2 illustrates an example sub-system 200. In some examples, sub-system 200 may represent a portion of a high bandwidth memory stack device such as HBM stack 105 shown in FIG. 1. For these examples, as shown in FIG. 2, sub-system 200 includes a first memory array 210-1 that may be accessed via channel A and a second memory array 210-2 that may be accessed via channel B. Data written to or read from memory array 210-1 may be routed through signal paths included in [ChA] I/Os 213 responsive to command and address signals routed through signal paths included in [ChA] CAs 215. Similarly, data written to or read from memory array 210-2 may be routed through signal paths included in [ChB] I/Os 217 responsive to command and address signals routed through [ChB] CAs 219. A control 214-1, decoders 212-1, a CA buffer 216-1 and first in first out (FIFO) buffer 218-1 may facilitate access to memory array 210-1. A control 214-2, decoders 212-2, a CA buffer 216-2 and a FIFO buffer 218-2 may facilitate access to memory array 210-2.

According to some examples, logic layer 220 may coordinate access to memory array 210-1 or 210-2. For simplicity, some components that may be included in a logic layer of an HBM stack for coordinating access to DRAM arrays are not shown in FIG. 2. The example logic layer 220 shown in FIG. 2 may include merge logic 224 and a mode register 222. Mode register 222 may be programmed or set to indicate a mode of operation for merge logic 224 to determine whether to operate in a full I/O mode or in a merged channel mode (e.g., a bit value of "1" to indicate merged channel or a value of "0" to indicate full I/O). A merged channel mode is depicted in FIG. 2 in that there are no separate active connections on bottom side 221 of logic layer 220 for both channel A and channel B. Rather, [ChB] I/O and CA connects are indicated as "No Connect", which means these connects are electrically or logically not connected/inactive. Thus, [ChA/B] I/Os 223 and [ChA/B] CAs 225 are routed through merged connections that would have been connects for just [ChA] I/O and CA connects if sub-system 200 was in a full I/O mode.

According to some examples, a full I/O mode may include 128 I/O connects for both channel A and channel B on bottom side 221 of logic layer 220. For these examples, merge logic 224 may cause signals for the full 128 I/O connects per channel to be routed through logic layer 220 at a first operating frequency (e.g., 2 gigatransfers per second (GT/s)). For example, first signals for the 128 I/O connects for channel A are routed through logic layer 220 to [ChA] I/Os 213 at the first operating frequency. Second signals for the 128 I/O connects for channel B are routed through logic layer 220 to [ChB] I/Os 217 also routed at the first operating frequency. In some examples, if merged channel mode is enabled, then the 128 I/O contacts are split so that channel A has 64 I/O active contacts and [ChB] has 64 I/O active contacts. For these examples, merge logic 224 may compensate for the reduced I/O active contacts per channel by doubling the first operating frequency to result in a second operating frequency (e.g., 4 GT/s) via which signals for each set of 64 I/O connects per channel are routed through logic layer 220. Hence, respective memory arrays 210-1 and 210-2 may see little to no reduction in data rates per unit time between the full I/O mode and the merged channel mode.

Figure 3A:
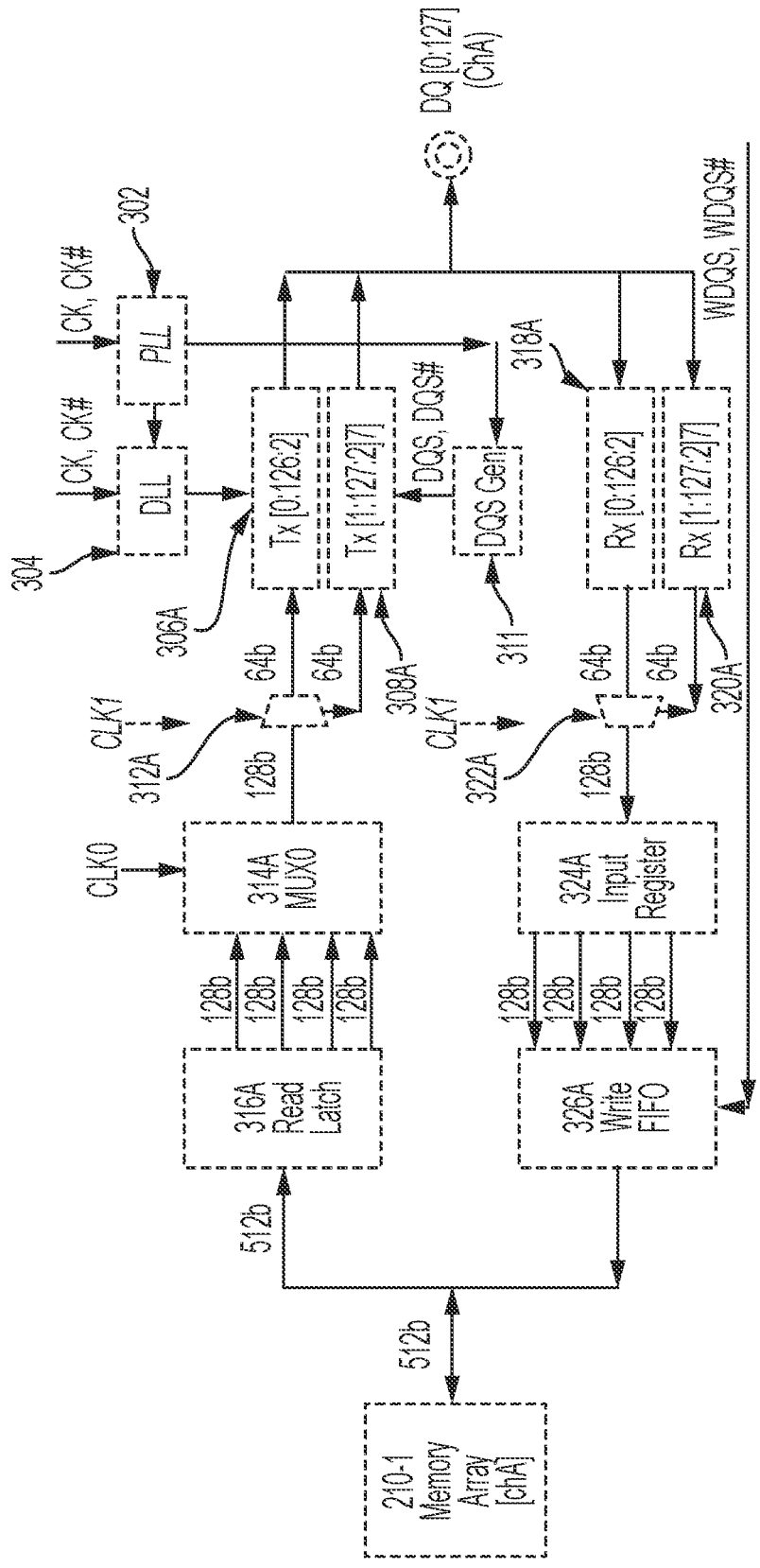
FIGS. 3A-3C illustrate example first operation modes.
Figure 3B:
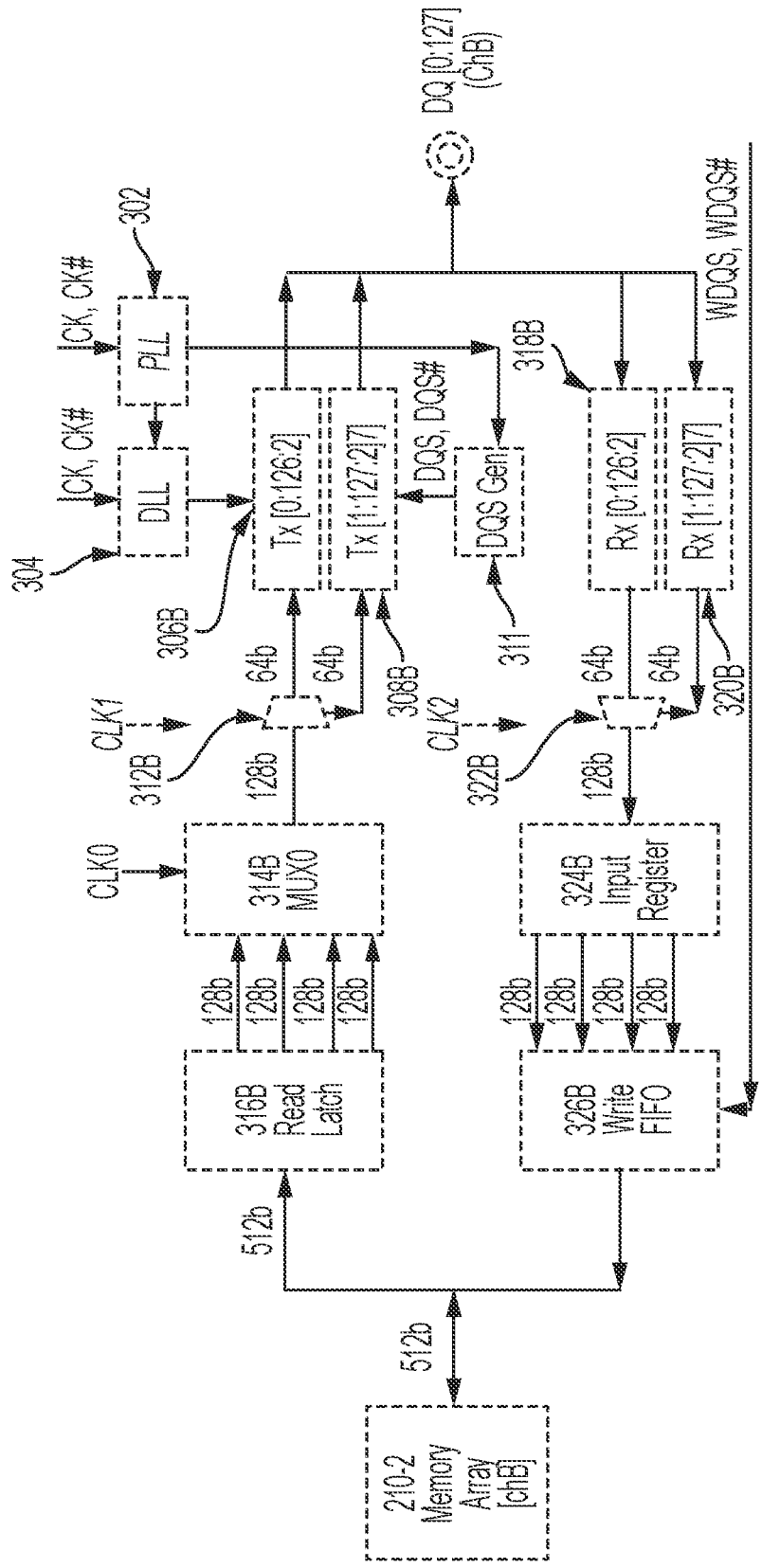
Figure 3C:
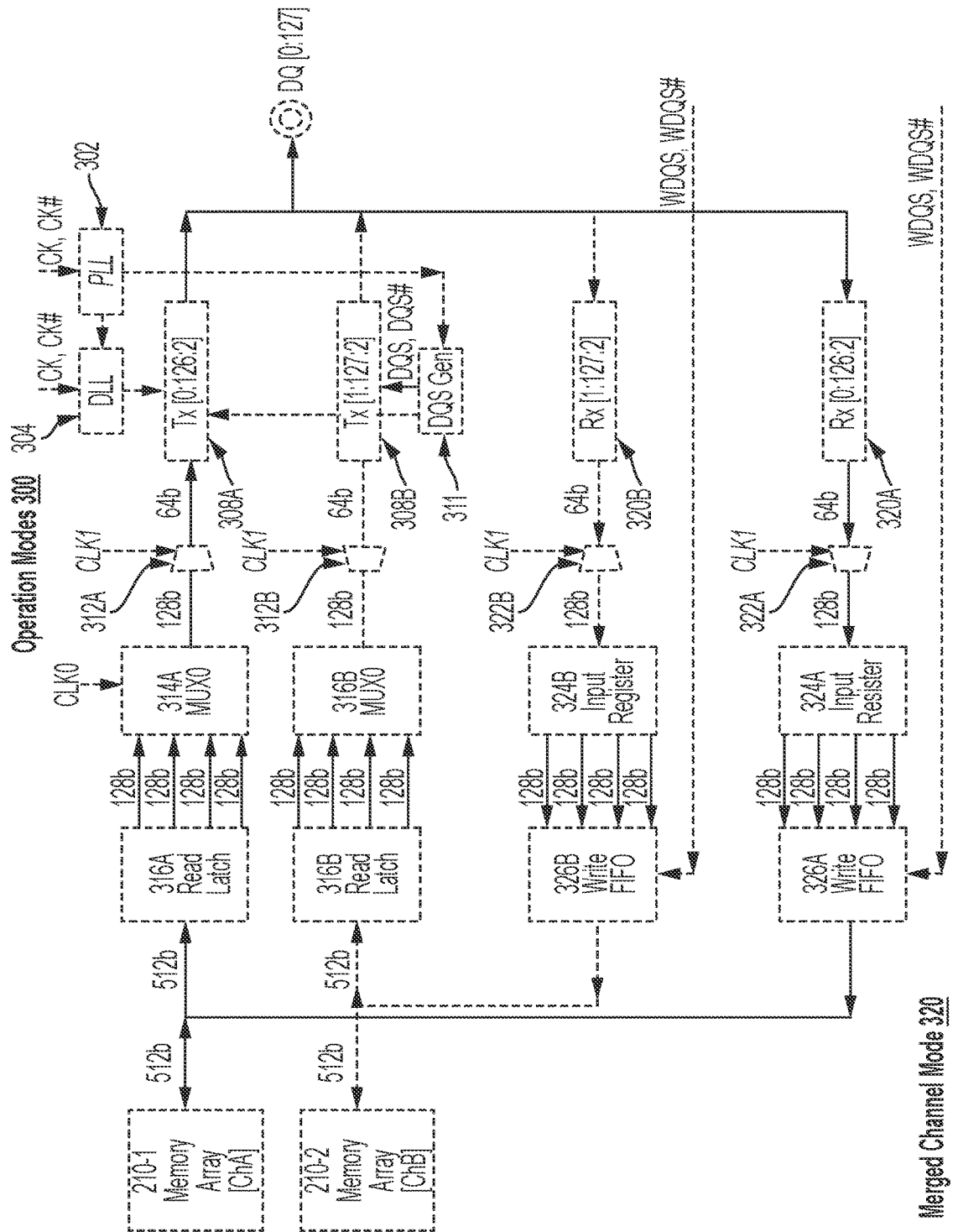

FIGS. 3A-3C illustrate example operation modes 300. In some examples, as shown in FIGS. 3A-3C, operation modes 300 may include a full I/O mode 310 and a merged channel mode 320. For these examples, the components shown in FIGS. 3A-3C may represent at least a portion of components used to route signals for 128 I/O connects for both DQ[0:127] (ChA) and DQ[0:127] (ChB) through logic layer 220 to memory arrays 210-1 and 210-2. For example, components to route signals for the 128 I/O connects for DQ[0:127] (ChA) may include a phase lock loop (PLL) 302, a delayed lock loop (DLL) 304, a transmit (Tx) circuit 306A (for even #bits), a Tx circuit 308A (for odd #bits), a DQ strobe (DQS) generator 311, a Tx multiplexor 312A, a MUX0 314A, a read latch 316A, a receive (Rx) circuit 318A (for even #bits), an Rx circuit 320A (for odd #bits), an Rx multiplexor 322A or a write FIFO 326A. Components to route signals for the 128 I/O connects for DQ[0:127] (ChB) may include a shared PLL 302, a shared DLL 304, a Tx circuit 306B (for even #bits), a Tx circuit 308B (for odd #bits), a shared DQS generator 311, a Tx multiplexor 312B, a MUX0 314B, a read latch 316B, an Rx circuit 318B (for even #bits), an Rx circuit 320B (for odd #bits), an Rx multiplexor 322B or a write FIFO 326B.

According to some examples, while in full I/O mode 310, components to route signals for 128 I/O connects for both DQ[0:127] (ChA) and DQ[0:127] (ChB) through logic layer 220 are active with the exception that "CLK1" is not applied to any of the Tx/Rx multiplexors for channel A or channel B components. For these examples, components for channel A and channel B may operate at a first clock frequency that may be slower than a clock frequency for "CLK1". For example, the first clock frequency may cause a transfer rate of 2 GT/s.

In some examples, merged channel mode 320 may be implemented based on applying "CLK1" to Tx multiplexors 312A/B and Rx multiplexors 322A/B to cause these multiplexors for channels A/B to operate at a second, faster clock frequency. For example, the second clock frequency may cause a transfer rate of 4 GT/s at Tx 308A/B and Rx 320A/B. For these examples, the 128 I/O connects previously allocated for DQ[0:127] (ChA) are now split such that 64 I/O connects go to DQ[0:126:2] (ChA) and 64 I/O connects go to DQ[1:127:2] (ChB). Also, for merged channel mode 320, Tx circuit 308A/B and Rx circuit 320A/B may be allocated for routing signals for these 64 I/O connects. The solid lines for merged channel mode 320 indicate I/O signals routed for channel A and the dashed lines indicate I/O signals routed for channel B.

Figure 4:
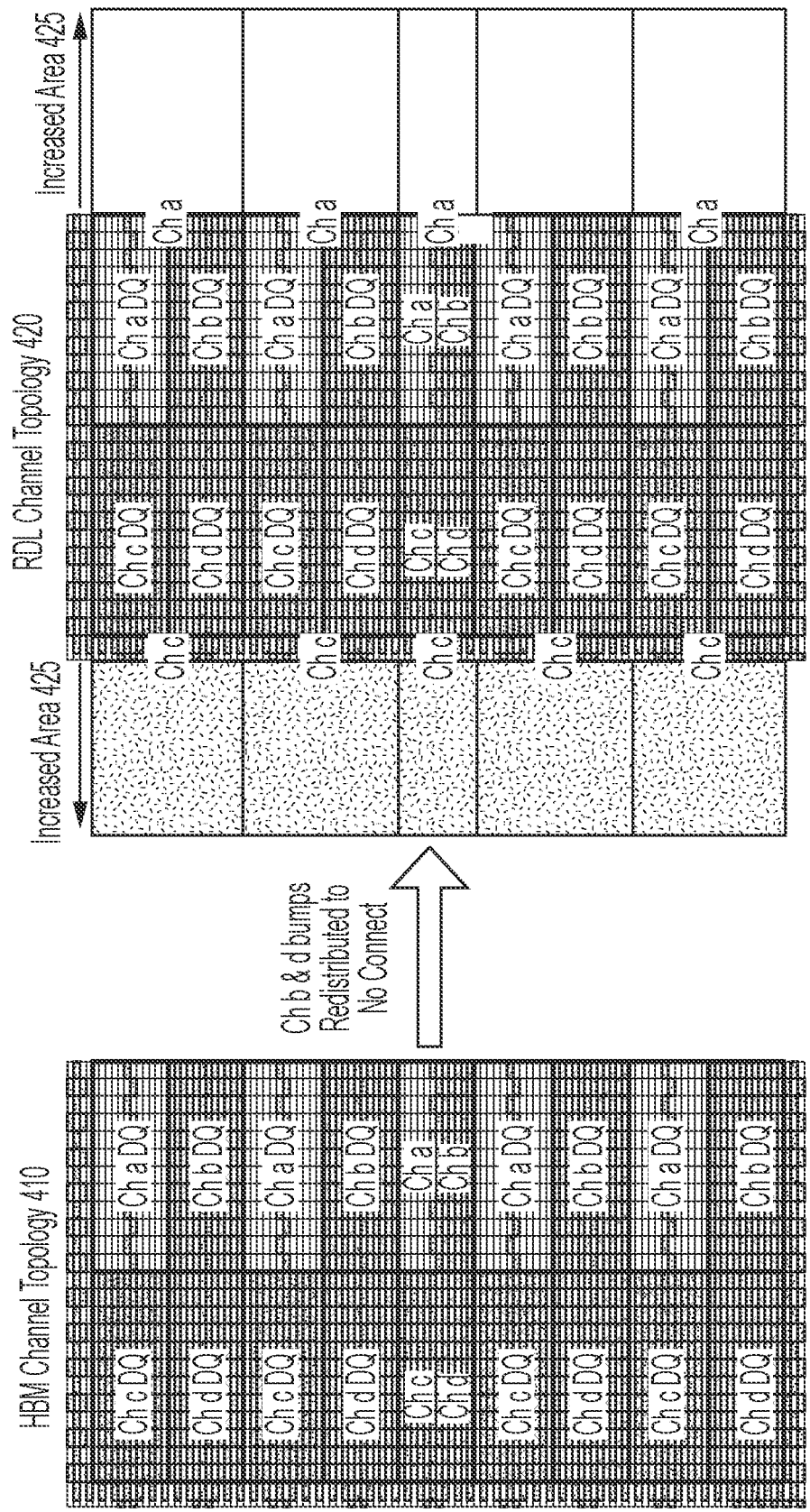
FIG. 4 illustrates an example first redistribution scheme.

FIG. 4 illustrates an example redistribution scheme 400. In some examples, as shown in FIG. 4, redistribution scheme 400 depicts how channel b and d bumps or connects for HBM channel topology 410 may be redistributed to no connect. For these examples, HBM channel topology 410 may represent a four channel topology for a stack of memory devices that couples to a top side of a logic layer for an HBM stack device such DRAMs 110-1 to 110-n coupling to a top side of logic layer 120. Also, redistribution layer (RDL) channel topology 420 may represent a merging of channels b and d with respective channels a and c that may result in reduced connects or bumps at a redistribution layer such as redistribution layer 130.

According to some examples, merging channels b and d with channels a and c may be implemented in a similar manner to the merging of I/O and CA connects mentioned above for FIGS. 2 and 3 responsive to placing an HBM stack device in a merged channel mode (e.g., merged channel mode 320). For these examples, bumps or connects for channels b and d on a bottom side of a logic layer for the HBM stack device may become no connects and then bumps or connects for channels a and c may be redistributed with an increased area shown in FIG. 4 as increased area 425. In some examples, bumps or connects may be spread apart to have larger pitches at the redistribution layer that connects the FIRM stack device to a package substrate. For example, pitches may be increased by a factor of 4 (4×) due to this type of channel merging.

FIG. 5 illustrates an example redistribution layout scheme 500. In some examples, as shown in FIG. 5, redistribution layout scheme 500 shows an HBM bump layout 510 and an overlay HBM bump vs. RDL bump 520. For these examples, HBM bumps 512 of HBM bump layout 510 may represent connects for I/O or CA signals of channel a and b on a bottom side of a logic layer for an HBM stack device and package substrate bumps 522 represent connects for merged channels a and b to connect to a redistribution layer that connects to a package substrate. Overlay HBM bump vs. RDL bump 520 does not show a complete merge of all of HBM bumps 512 for channel b with channel a. The larger package substrate bumps 522 over the smaller HBM bumps 512 are shown to provide an example perspective of how larger bump pitches may be accomplished when channels are merged. The larger bump pitches, for example, may allow for more flexible routing of signal paths between the HBM stack and a CPU or GPU.

Figure 6:
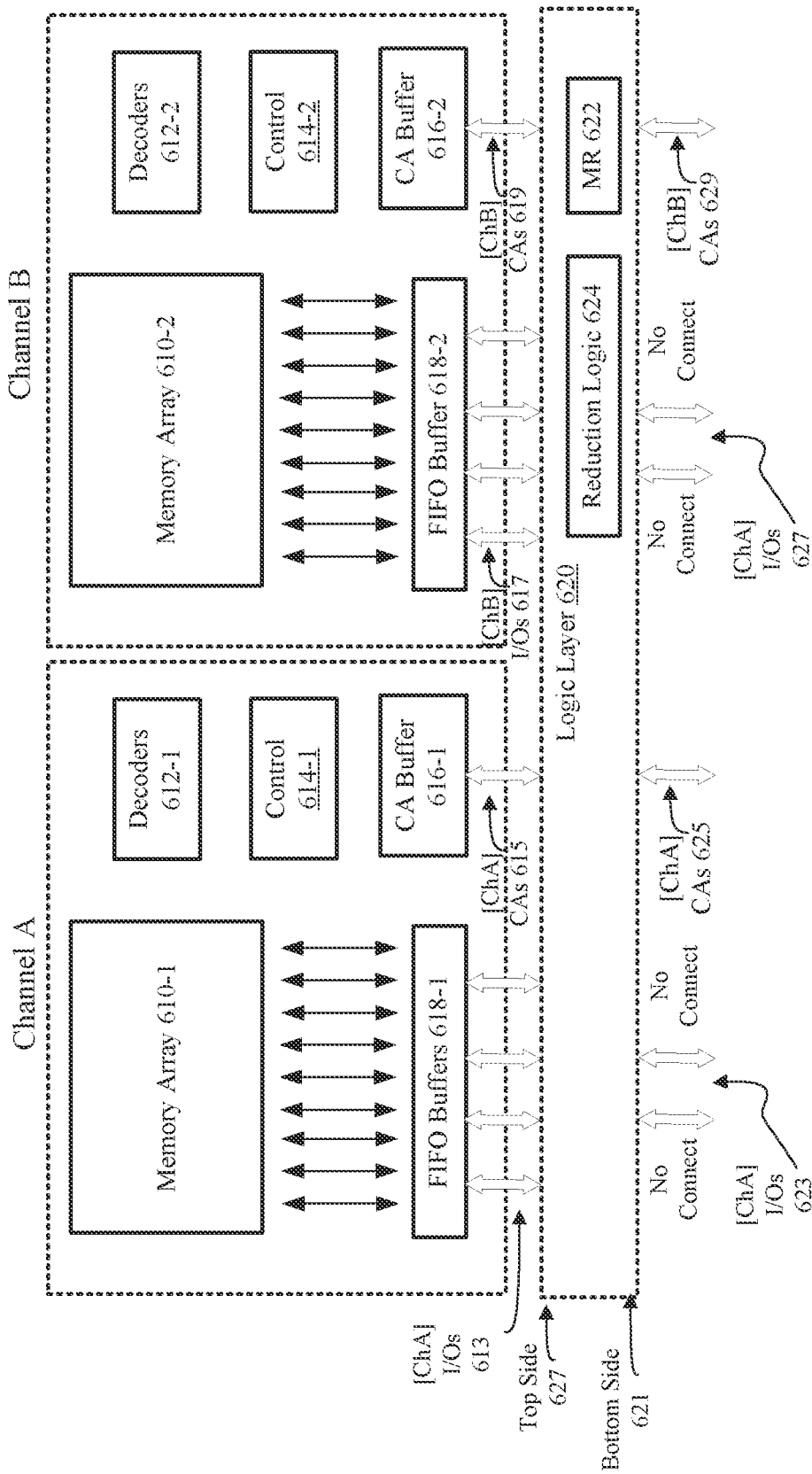
FIG. 6 illustrates an example second sub-system.

FIG. 6 illustrates an example sub-system 600. In some examples, sub-system 600 may be similar to sub-system 200 shown in FIG. 2 and may also represent a portion of an HBM stack such as HBM stack 105 shown in FIG. 1. For these examples, as shown in FIG. 6, sub-system 600 includes a first memory array 610-1 that may be accessed via channel A and a second memory array 610-2 that may be accessed via channel B. Data written to or read from memory array 610-1 may be routed through signal paths included in [CHA] I/Os 613 responsive to command and address signals routed through signal paths included in [ChA] CAs 615. Similarly, data written to or read from memory array 610-2 may be routed through signal paths included in [ChB] I/Os 617 responsive to command and address signals routed through [ChB] CAs 619. A control 614-1, decoders 612-1, a CA buffer 616-1 and FIFO buffer 618-1 may facilitate access to memory array 610-1. A control 614-2, decoders 612-2, a CA buffer 616-2 and a FIFO buffer 618-2 may facilitate access to memory array 610-2.

According to some examples, logic layer 620 may coordinate access to memory array 610-1 or 610-2. For simplicity, some components that may be included in a logic layer of an HBM stack for coordinating access to DRAM arrays are not shown in FIG. 6. The example logic layer 620 shown in FIG. 6 may include reduction logic 624 and a mode register 622. Mode register 622 may be programmed or set to indicate a mode of operation for reduction logic 624 to determine whether to operate in a full I/O mode or in a partial I/O mode (e.g., a bit value of "1" to indicate partial I/O mode or a value of "0" to indicate full I/O mode). A partial I/O mode is depicted in FIG. 6 in that there is a reduction in I/O connections on bottom side 621 of logic layer 620 for both channel A and channel B. Thus, [ChA] I/Os 623 and [ChB] I/Os 627 include fewer active connects compared to respective [ChA] I/Os 613 and [ChB] I/Os 617.

According to some examples, a full I/O mode may include 128 I/O connects for both channel A and channel B on bottom side 621 of logic layer 620. For these examples, reduction logic 624 may cause signals for the full 128 I/O connects per channel to be routed through logic layer 620 at a first operating frequency resulting in a first transfer rate (e.g., 2 GT/s). For example, first signals for the 128 I/O connects for [ChA] are routed through logic layer 220 to [ChA] I/Os 613 at the first operating frequency. Second signals for the 128 I/O connects for [ChB] are routed through logic layer 620 to [ChB] I/Os 617 also routed at the first operating frequency. In some examples, if partial I/O mode is enabled, then channel A has 64 of 128 I/O contacts for [ChM] I/Os 623 as active and channel B has 64 of 128 I/O contacts for [ChB] CAs 629 as active contacts. For these examples, reduction logic 624 may compensate for the reduced I/O active contacts per channel by doubling the first operating frequency to result in a second operating frequency via which signals for each set of 64 I/O connects per channel are routed through logic layer 620 that results in a second transfer rate (e.g., 4 GT/s). Hence, respective memory arrays 610-1 and 610-2 may see little to no reduction in data rates per unit time between the full I/O mode and the merged channel mode.

Figure 7A:
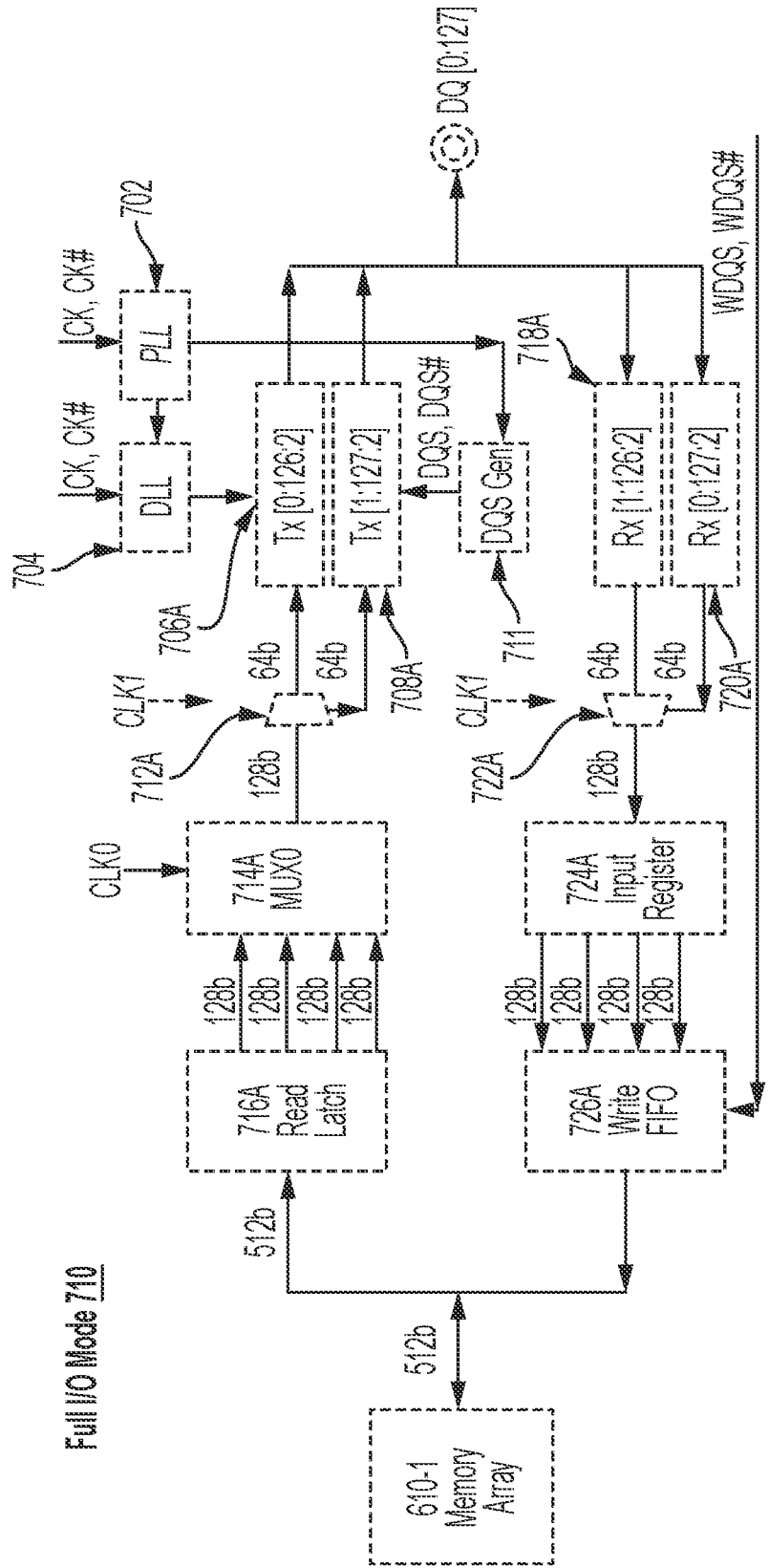
FIGS. 7A and 7B illustrate example second operation modes.
Figure 7B:
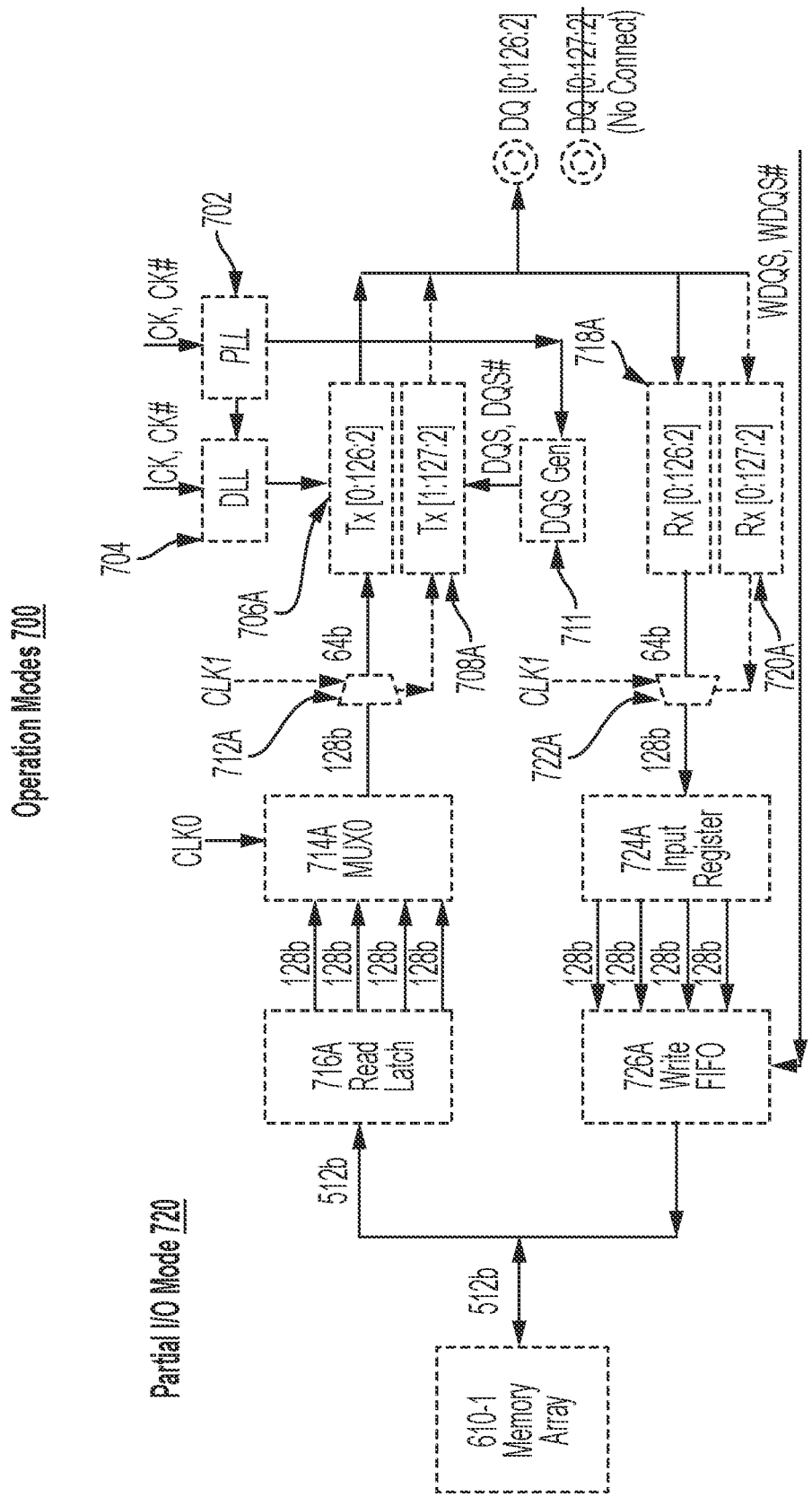

FIGS. 7A and 7B illustrate example operation modes 700. In some examples, as shown in FIGS. 7A and 7B, operation modes 700 may include a full I/O mode 710 and a partial I/O mode 720. For these examples, the components shown in FIGS. 7A and 7B may represent at least a portion of components used to route signals for 128 I/O connects for DQ[0:127] through logic layer 620 to memory array 210-1. For example, components to route signals for the 128 I/O connects for DQ[0:127] (ChA) may include a PLL 702, a DLL 704, a Tx circuit 706A, a Tx circuit 708A, a DQS generator 711, a Tx multiplexor 712A, a MUX0 714A, a read latch 716A, an Rx circuit 718A, an Rx circuit 720A, an Rx multiplexor 722A or a write FIFO 726A.

According to some examples, while in full I/O mode 710, components to route signals for 128 I/O connects for DQ[0:127] (ChA) through logic layer 620 are active with the exception that "CLK1" is not applied to the Tx/Rx multiplexors for channel A components. For these examples, components for channel A may operate at a first clock frequency that may be slower than a clock frequency for "CLK1". For example, the first clock frequency may be 2 GT/s.

In some examples, partial I/O mode 720 may be implemented based on applying "CLK1" to Tx multiplexor 712A and Rx multiplexor 722A to cause these components for channel A to operate at a second, faster clock frequency. For example, the second clock frequency may be 4 GT/s. For these examples, the 64 I/O connects previously allocated for DQ[0:127:2] are now a no connect for partial I/O mode 720.

FIG. 8 illustrates an example redistribution scheme 800. In some examples, as shown in FIG. 8, redistribution scheme 800 depicts how half of the DQ bumps for I/O channels of HBM channel topology 810 are not connected "NC" or inactive for partial RDL channel topology 820. For these examples, similar to FIG. 4, HBM channel topology 810 may represent a four channel topology for a stack of memory devices that couples to a top side of a logic layer for an HBM stack device such DRAMs 110-1 to **110-*n* coupling to a top side of logic layer 120. Also, redistribution layer (RDL) channel topology 820 may represent a reduction in a number of I/O connects active at a bottom side of the logic layer that connect to a redistribution layer such as redistribution layer 130**.

According to some examples, a reduction in a number of I/O connects active at a bottom side of a logic layer for an HBM stack device may still include CA signals. Compared to redistribution scheme 400, pitch of bumps or connects for partial RDL channel topology may not be increased as much at the redistribution layer as was mentioned above for redistribution scheme 400. But the reduction in I/O contacts may still allow for pitches to be increased by around a factor of 2 (2×).

Figure 9:
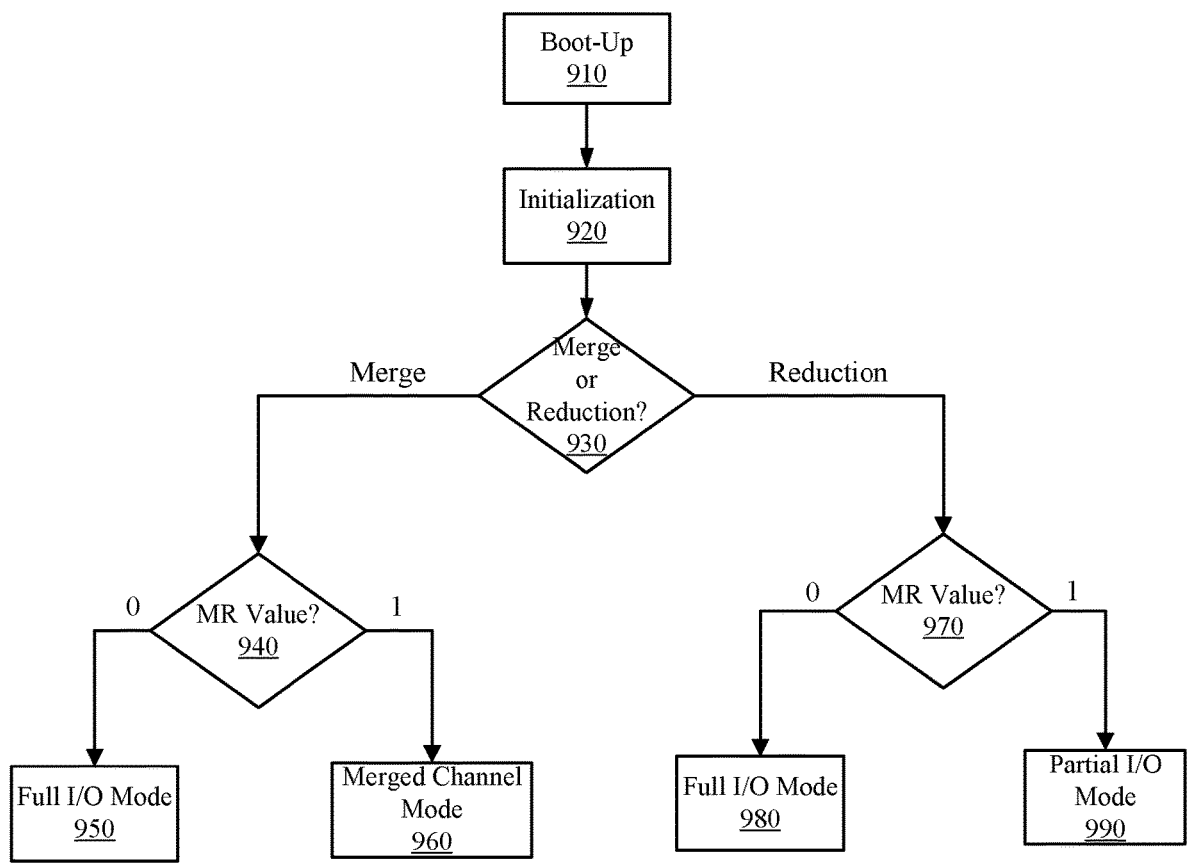
FIG. 9 illustrates an example first logic flow.

FIG. 9 illustrates an example logic flow 900. In some examples, logic flow 900 may illustrate a logic flow for deployment of an HBM stack device to couple with a package substrate that may be part of a system on a chip (SOC) or a system in package (SiP). For these examples, logic flow 900 may be implemented by circuitry, logic and/or features of logic layers 120, 220 or 620 such as merge logic 224 shown in FIG. 2 or reduction logic 624 shown in FIG. 6. Also, a mode register used by the circuitry, logic and/or features may be set or programmed as mentioned above for FIGS. 2-3C and 6-7B. Examples are not limited to these elements implementing logic flow 900.

Starting at block 910, an HBM device may boot-up or may be powered on.

Moving from block 910 to block 920, an initialization of circuitry, logic and/or features of a logic layer for the HBM device may be completed. The initialization may include gathering capabilities of the logic layer and/or the HBM device (e.g., number of memory devices, channels, I/O contacts, etc.).

Moving from block 920 to decision block 930, the gathered capabilities are assessed to determine whether the logic layer are arranged to implement or execute merge or reduction logic. If merge logic, logic flow 900 moves to decision block 940. If reduction logic, logic flow 900 moves to decision bloc 970.

Moving from decision block 930 to decision block 940, merge logic (e.g., merge logic 224) of the logic layer may read a mode register (e.g., MR 222) to determine what bit value is indicated. If the bit value is 0, logic flow 900 moves to block 950. If the bit value is 1, logic flow 900 moves to block 960.

Moving from decision block 940 to block 950, the merge logic may operate in a full I/O mode that may utilize all I/O and CA connects routed through at least two channels coupled with respective memory arrays of memory devices included in the HBM device (e.g., operate in full I/O mode 310).

Moving from decision block 940 to block 960, the merge logic may operate in a merged channel mode that may merge I/O and CA connects for two channels coupled with respective memory arrays of memory devices included in the HBM device (e.g., operate in merge channel mode 320).

Moving from decision block 930 to decision block 970, reduction logic (e.g., reduction logic 622) of the logic layer may read a mode register (e.g., MR 622) to determine what bit value is indicated. If the bit value is 0, logic flow moves to block 980. If the bit value is 1, logic flow 900 moves to block 990.

Moving from decision block 970 to block 980, the reduction logic may operate in a full I/O mode that may utilize all I/O and CA connects routed through at least two channels coupled with respective memory arrays of memory devices included in the HBM device (e.g., operate in full I/O mode 610).

Moving from decision block 970 to block 990, the reduction logic may operate in a partial I/O mode that may reduce active I/O connects for at least two channels coupled with respective memory arrays of memory devices included in the HEM device (e.g., operate partial I/O mode 620).

Figure 10:
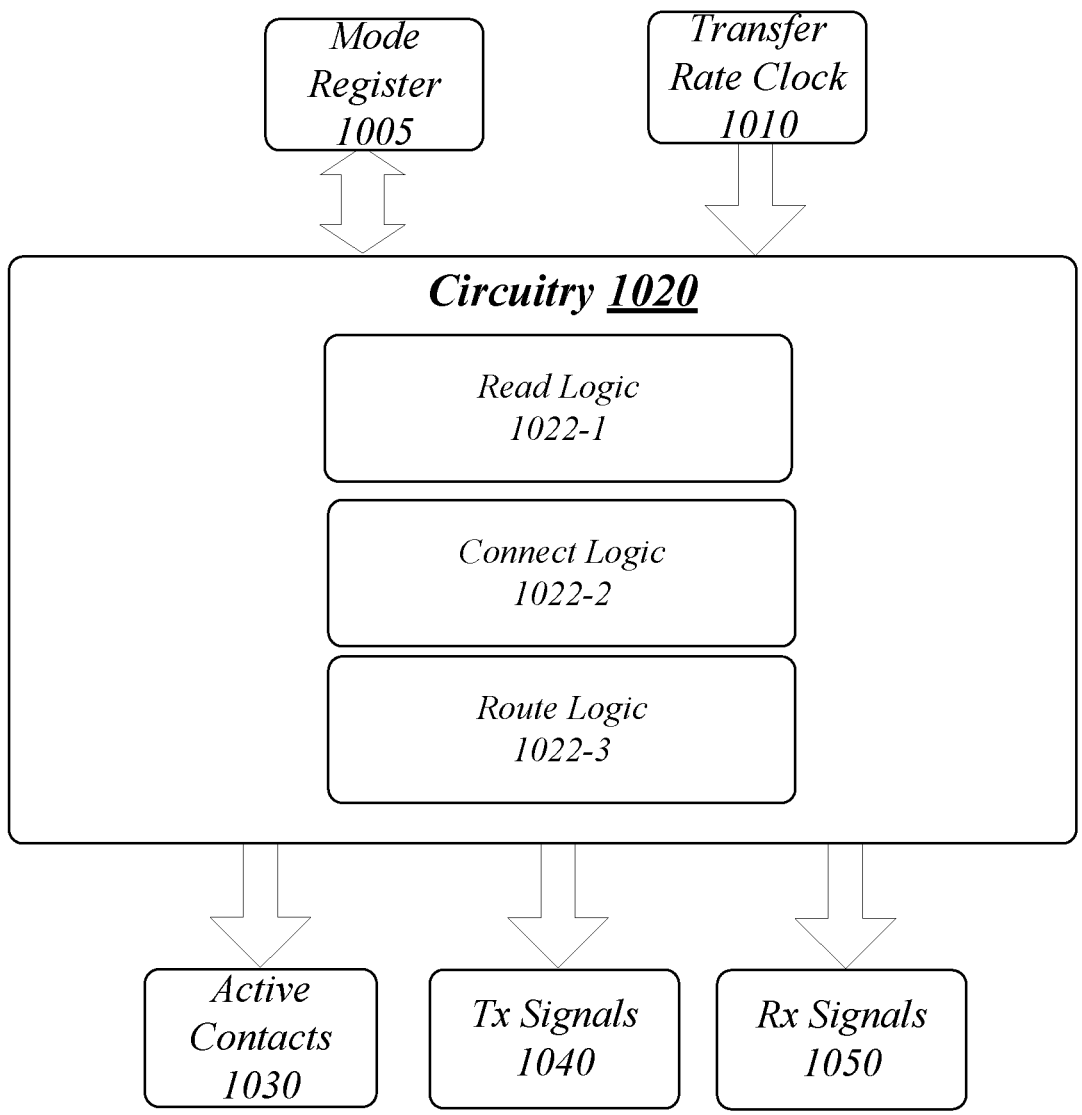
FIG. 10 illustrates an example apparatus.

FIG. 10 illustrates an example block diagram for apparatus 1000. Although apparatus 1000 shown in FIG. 10 has a limited number of elements in a certain topology, it may be appreciated that apparatus 1000 may include more or less elements in alternate topologies as desired for a given implementation.

According to some examples, apparatus 1000 may be supported by circuitry 1020 of a located at a logic layer of a high bandwidth memory stack device such as logic layer 120, 220 or 620. Circuitry 1020 may be arranged to execute logic or one or more firmware implemented modules, components or features of the logic. It is worthy to note that "*a*" and "b" and "c" and similar designators as used herein are intended to be variables representing any positive integer. Thus, for example, if an implementation sets a value for *a*=3, then a complete set of software or firmware for modules, components of logic **1022-*a* may include logic 1022-1, 1022-2 or 1022-3. The examples presented are not limited in this context and the different variables used throughout may represent the same or different integer values. Also, "module", "component" or "feature" may also include firmware stored in computer-readable or machine-readable media, and although types of features are shown in FIG. 10** as discrete boxes, this does not limit these types of features to storage in distinct computer-readable media components (e.g., a separate memory, etc.) or implementation by distinct hardware components (e.g., separate application-specific integrated circuits (ASICs) or field programmable gate arrays (FPGAs)).

According to some examples, circuitry 1020 may include one or more ASICs or FPGAs and, in some examples, at least some logic 1022-*a* may be implemented as hardware elements of these ASICs or FPGAs.

According to some examples, as shown in FIG. 10, apparatus 1000 may include a mode register 1005. For these examples, mode register 1005 may be set or programmed to indicate a mode of operation for routing I/O or CA signals through a logic layer of a high bandwidth memory stack device. For example, a full I/O mode, a merged channel mode or a partial I/O mode.

In some examples, apparatus 1000 may also include a read logic 1022-1. Read logic 1022 may be executed or supported by circuitry 1020 to read a bit value of mode register 1005. For example, mode register 1005 may have a bit value of 1 or a bit value of 0.

According to some examples, apparatus 1000 may also include a connect logic 1022-2. Connect logic 1022-2 may be executed or supported by circuitry 1020 to cause, based on the bit value of mode register 1005, a portion of I/O contacts on a bottom side of the logic layer to be active and a remaining portion of the I/O contacts to be inactive. For these examples, the first portion of I/O contacts may be arranged to receive or transmit I/O signals for one or more data channels to access the plurality of memory devices. Active contacts 1030 may include the portion of I/O contacts that connect logic 1022-2 causes to be active based on the bit value indicated by mode register 1005.

In some examples, apparatus 1000 may also include a route logic 1022-3. Route logic 1022-3 may be executed or supported by circuitry 1020 to cause I/O signals to be routed via the one or more data channels through the portion of I/O contacts such that a redirection layer below the logic layer enables the high bandwidth memory stack device to connect with a package substrate through a reduced number of I/O contacts. For these examples, Tx signals 1040 may include I/O signals routed from (e.g., data read from) the plurality of memory devices and Rx signals 1050 may include I/O signals routed to (data written to) the plurality of memory devices. In some examples, transfer rate clock 1010 may be used by route logic 1022-3 to increase the transfer rate to compensate for not activating all the I/O contacts.

Various components of apparatus 1000 may be communicatively coupled to each other by various types of communications media to coordinate operations. The coordination may involve the uni-directional or bi-directional exchange of information. For instance, the components may communicate information in the form of signals communicated over the communications media. The information can be implemented as signals allocated to various signal lines. In such allocations, each message is a signal. Further embodiments, however, may alternatively employ data messages. Such data messages may be sent across various connections. Example connections include parallel interfaces, serial interfaces, and bus interfaces.

Included herein is a set of logic flows representative of example methodologies for performing novel aspects of the disclosed architecture. While, for purposes of simplicity of explanation, the one or more methodologies shown herein are shown and described as a series of acts, those skilled in the art will understand and appreciate that the methodologies are not limited by the order of acts. Some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all acts illustrated in a methodology may be required for a novel implementation.

A logic flow may be implemented in software, firmware, and/or hardware. In software and firmware embodiments, a logic flow may be implemented by computer executable instructions stored on at least one non-transitory computer readable medium or machine readable medium, such as an optical, magnetic or semiconductor storage. The embodiments are not limited in this context.

FIG. 11 illustrates an example logic flow 1100. Logic flow 1100 may be representative of some or all of the operations executed by one or more logic, features, or devices described herein, such as apparatus 1000. More particularly, logic flow 1100 may be implemented by read logic 1022-1, connect logic 1022-2 or route logic 1022-3.

According to some examples, logic flow 1100 at block 1102 may determine, via a mode register, a mode of operation for a high bandwidth memory stack device include a plurality of memory devices stacked above a logic layer. For these examples, read logic 1022-1 may read the mode register.

In some examples, logic flow 1100 at block 1104 may cause, based on the determined mode of operation, a portion of I/O contacts on a bottom side of the logic layer to be active and a remaining portion of the I/O contacts to be inactive, the first portion of I/O contacts arranged to receive or transmit I/O signals for one or more data channels to access the plurality of memory devices. For these examples, connect logic 1022-2 may cause the I/O contacts to be active or inactive.

According to some examples, logic flow 1100 at block 1106 may cause I/O signals to be routed via the one or more data channels through the portion of I/O contacts such that a redirection layer below the logic layer enables the high bandwidth memory stack device to connect with a package substrate through a reduced number of I/O contacts. For these examples, route logic 1022-3 may cause the I/O signals to be routed via the one or more data channels.

FIG. 12 illustrates an example storage medium 1200. In some examples, storage medium 1200 may be an article of manufacture. Storage medium 1200 may include any non-transitory computer readable medium or machine readable medium, such as an optical, magnetic or semiconductor storage. Storage medium 1200 may store various types of computer executable instructions, such as instructions to implement logic flow 1100. Examples of a computer readable or machine readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The examples are not limited in this context.

Figure 13:
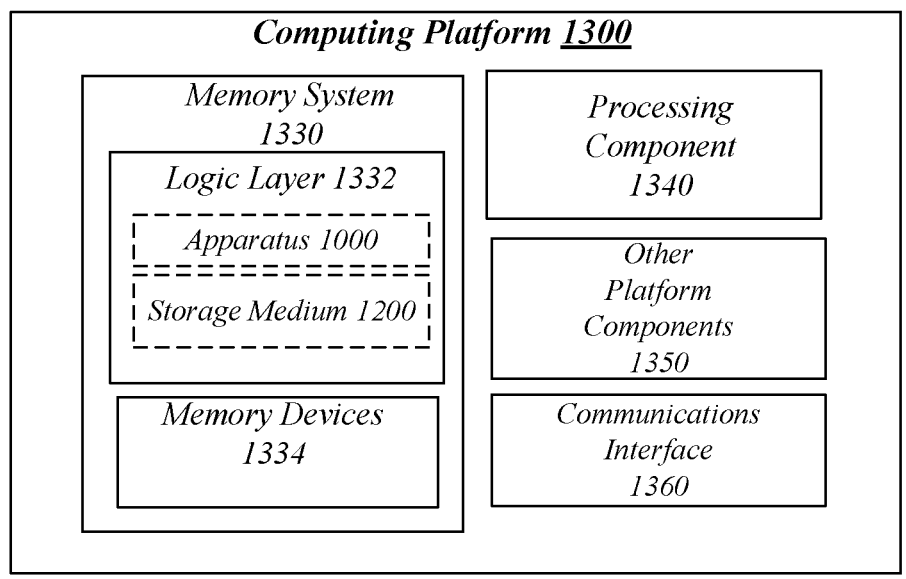
FIG. 13 illustrates an example second system.

FIG. 13 illustrates an example computing platform 1300. In some examples, as shown in FIG. 13, computing platform 1300 may include a memory system 1330, a processing component 1340, other platform components 1350 or a communications interface 1360. According to some examples, computing platform 1300 may be implemented as a system on a chip (SOC) or a system in a package (SiP).

According to some examples, memory system 1330 may by a high bandwidth memory stack device that includes a logic layer 1332 and memory devices 1334. For these examples, logic and/or features resident at or located at logic layer 1332 may execute at least some processing operations or logic for apparatus 1000 and may include storage media that includes storage medium 1200. Also, memory device(s) 1334 may include similar types of volatile or non-volatile memory (e.g., DRAM).

According to some examples, Processing components 1340 may include various hardware elements, software elements, or a combination of both. Examples of hardware elements may include devices, logic devices, components, processors, microprocessors, management controllers, companion dice, circuits, processor circuits, circuit elements (e.g., transistors, resistors, capacitors, inductors, and so forth), integrated circuits, ASICs, programmable logic devices (PLDs), digital signal processors (DSPs), FPGAs, memory units, logic gates, registers, semiconductor device, chips, microchips, chip sets, and so forth. Examples of software elements may include software components, programs, applications, computer programs, application programs, device drivers, system programs, software development programs, machine programs, operating system software, middleware, firmware, software modules, routines, subroutines, functions, methods, procedures, software interfaces, application program interfaces (APIs), instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given example.

In some examples, other platform components 1350 may include common computing elements, additional memory units, chipsets, controllers, peripherals, interfaces, oscillators, timing devices, video cards, audio cards, multimedia input/output (I/O) components (e.g., digital displays), power supplies, and so forth. Examples of memory units or memory devices may include without limitation various types of computer readable and machine readable storage media in the form of one or more higher speed memory units, such as read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EEPROM), flash memory, polymer memory such as ferroelectric polymer memory, ovonic memory, phase change or ferroelectric memory, silicon-oxide-nitride-oxide-silicon (SONOS) memory, magnetic or optical cards, an array of devices such as Redundant Array of Independent Disks (RAID) drives, solid state memory devices (e.g., USB memory), solid state drives (SSD) and any other type of storage media suitable for storing information.

In some examples, communications interface 1360 may include logic and/or features to support a communication interface. For these examples, communications interface 1360 may include one or more communication interfaces that operate according to various communication protocols or standards to communicate over direct or network communication links. Direct communications may occur via use of communication protocols or standards described in one or more industry standards (including progenies and variants) such as those associated with the PCIe specification, the NVMe specification or the I3C specification. Network communications may occur via use of communication protocols or standards such those described in one or more Ethernet standards promulgated by the Institute of Electrical and Electronics Engineers (IEEE). For example, one such Ethernet standard promulgated by IEEE may include, but is not limited to, IEEE 802.3-2018, Carrier sense Multiple access with Collision Detection (CSMA/CD) Access Method and Physical Layer Specifications, Published in August 2018 (hereinafter "IEEE 802.3 specification"). Network communication may also occur according to one or more OpenFlow specifications such as the OperFlow Hardware Abstraction API Specification. Network communications may also occur according to one or more Infiniband Architecture specifications.

The components and features of computing platform 1300 may be implemented using any combination of discrete circuitry, ASICs, logic gates and/or single chip architectures. Further the features of computing platform 1300 may be implemented using microcontrollers, programmable logic arrays and/or microprocessors or any combination of the foregoing where suitably appropriate. It is noted that hardware, firmware and/or software elements may be collectively or individually referred to herein as "logic", "circuit" or "circuitry."

It should be appreciated that the exemplary computing platform 1300 shown in the block diagram of FIG. 13 may represent one functionally descriptive example of many potential implementations. Accordingly, division, omission or inclusion of block functions depicted in the accompanying figures does not infer that the hardware components, circuits, software and/or elements for implementing these functions would necessarily be divided, omitted, or included in embodiments.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations, known as "IP cores" and may be similar to IP blocks, IP cores may be stored on a tangible, machine readable medium and supplied to various customers or manufacturing facilities to load into the fabrication machines that actually make the logic or processor.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

Some examples may include an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

Some examples may be described using the expression "in one example" or "an example" along with their derivatives. These terms mean that a particular feature, structure, or characteristic described in connection with the example is included in at least one example. The appearances of the phrase "in one example" in various places in the specification are not necessarily all referring to the same example.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled" or "coupled with", however, may also mean that two or more elements are not in direct contact with each other, but yet still co-operate or interact with each other.

To the extent various operations or functions are described herein, they can be described or defined as software code, instructions, configuration, and/or data. The content can be directly executable ("object" or "executable" form), source code, or difference code ("delta" or "patch" code). The software content of what is described herein can be provided via an article of manufacture with the content stored thereon, or via a method of operating a communication interface to send data via the communication interface. A machine readable storage medium can cause a machine to perform the functions or operations described and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

The follow examples pertain to additional examples of technologies disclosed herein.

Example 1. An example apparatus may include a mode register to indicate a mode of operation for a high bandwidth memory stack device to include a plurality of memory devices stacked above a logic layer. The apparatus may also include circuitry at the logic layer to execute logic. The logic may read a bit value of the mode register and cause, based on the bit value of the mode register, a portion of I/O contacts on a bottom side of the logic layer to be active and a remaining portion of the I/O contacts to be inactive. The portion of I/O contacts may be arranged to receive or transmit I/O signals for one or more data channels to access the plurality of memory devices.

Example 2. The apparatus of example 1, the logic may also cause I/O signals to be routed via the one or more data channels through the portion of I/O contacts such that a redirection layer below the logic layer enables the high bandwidth memory stack device to connect with a package substrate through a reduced number of I/O contacts.

Example 3. The apparatus of example 1, the logic may cause the I/O signals to be routed via the one or more data channels through the portion of I/O contacts at a first transfer rate per second that is twice a second transfer rate per second if the I/O signals were routed via the one or more data channels through both the portion of I/O contacts and the remaining portion of I/O contacts.

Example 4. The apparatus of example 2, the high bandwidth memory stack device may connect with the package substrate via first contacts having a larger pitch between the first contacts compared to second contacts that correspond to both active and inactive I/O contacts on the bottom side of the logic layer.

Example 5. The apparatus of example 4, the package substrate may include I/O signal paths routed between the high bandwidth memory device and a central processing unit or a graphics processing unit, the I/O signal paths to couple with the first contacts.

Example 6. The apparatus of example 1, the portion and the remaining portion of I/O contacts may be included in a plurality of I/O contacts for a first data channel from among the one or more data channels, the first data channel to access a memory array at a memory device from among the plurality of memory devices, the portion to include half of the plurality of I/O contacts.

Example 7. The apparatus of example 1, the portion of I/O contacts and the remaining portion of I/O contacts may be included in a plurality of I/O contacts for a first data channel and a second data channel from among the one or more data channels. The first data channel may access a first memory array at a memory device from among the plurality of memory devices. The second data channel may access a second memory array at the memory device, the portion to include half of the plurality of I/O contacts for the first and the second data channels.

Example 8. The apparatus of example 7, the logic may also cause, based on the bit value of the mode register, a portion of CA contacts on the bottom side of the logic layer to be active and a remaining portion of the CA contacts to be inactive. The portion of CA contacts may be arranged to receive or transmit CA signals for the first and the second data channels to facilitate access to the plurality of memory devices. The logic may also cause CA signals for the first and the second data channels to be routed through the portion of CA contacts such that a redirection layer below the logic layer enables the high bandwidth memory stack device to connect with a package substrate through a reduced number of CA contacts.

Example 9. The apparatus of example 1, the plurality of memory devices may include dynamic random access memory.

Example 10. An example memory device may include a plurality of stacked memory dice. The memory device may also include a mode register to indicate a mode of operation. The memory device may also include a logic layer located below the plurality of stacked memory dice, the logic layer to include circuitry to execute logic. The logic may read a bit value of the mode register and cause, based on the bit value of the mode register, a portion of I/O contacts on a bottom side of the logic layer to be active and a remaining portion of the I/O contacts to be inactive. The portion of I/O contacts may be arranged to receive or transmit I/O signals for one or more data channels to access at least one memory array maintained on at least one memory die of the plurality of stacked memory die.

Example 11. The memory device of example 10, the logic may also cause I/O signals to be routed via the one or more data channels through the portion of I/O contacts such that a redirection layer below the logic layer enables the memory device to connect with a package substrate through a reduced number of I/O contacts.

Example 12. The memory device of example 10, the logic may cause the I/O signals to be routed via the one or more data channels through the portion of I/O contacts at a first transfer rate per second that is twice a second transfer rate per second if the I/O signals were routed via the one or more data channels through both the portion of I/O contacts and the remaining portion of I/O contacts.

Example 13. The memory device of example 12, the memory device may connect with a package substrate via first contacts having a larger pitch between the first contacts compared to second contacts that correspond to both active and inactive I/O contacts on the bottom side of the logic layer.

Example 14. The memory device of example 13, the package substrate including I/O signal paths routed between the memory device and a central processing unit or a graphics processing unit, the I/O signal paths to couple with the first contacts.

Example 15. The memory device of example 10, the portion and the remaining portion of I/O contacts may be included in a plurality of I/O contacts for a first data channel from among the one or more data channels. The first data channel may access a first memory array maintained on the at least one memory die, the portion to include half of the plurality of I/O contacts.

Example 16. The memory device of example 10, the portion of I/O contacts and the remaining portion of I/O contacts may be included in a plurality of I/O contacts for a first data channel and a second data channel from among the one or more data channels. The first data channel may access a first memory array maintained on the at least one memory die. The second data channel may access a second memory array maintained on the at least one memory die. The portion to include half of the plurality of I/O contacts for the first and the second data channels.

Example 17. The memory device of example 16, the logic may also cause, based on the bit value of the mode register, a portion of CA contacts on the bottom side of the logic layer to be active and a remaining portion of the CA contacts to be inactive. The portion of CA contacts arranged to receive or transmit CA signals for the first and the second data channels to facilitate access to the first and the second memory arrays. The logic may also cause CA signals for the first and the second data channels to be routed through the portion of CA contacts such that a redirection layer below the logic layer enables the memory device to connect with a package substrate through a reduced number of CA contacts.

Example 18. The memory device of example 10, the plurality of memory dice may include dynamic random access memory.

Example 19. An example method may include determining, via a mode register, a mode of operation for a high bandwidth memory stack device include a plurality of memory devices stacked above a logic layer. The method may also include causing, based on the determined mode of operation, a portion of I/O contacts on a bottom side of the logic layer to be active and a remaining portion of the I/O contacts to be inactive. The portion of I/O contacts may be arranged to receive or transmit I/O signals for one or more data channels to access the plurality of memory devices.

Example 20. The method of example 19 may also include causing I/O signals to be routed via the one or more data channels through the portion of I/O contacts such that a redirection layer below the logic layer enables the high bandwidth memory stack device to connect with a package substrate through a reduced number of I/O contacts.

Example 21. The method of example 19 may also include causing the I/O signals to be routed via the one or more data channels through the portion of I/O contacts at a first transfer rate per second that is twice a second transfer rate per second if the I/O signals were routed via the one or more data channels through both the portion of I/O contacts and the remaining portion of I/O contacts.

Example 22. The method of example 20, the high bandwidth memory stack device may connect with the package substrate via first contacts having a larger pitch between the first contacts compared to second contacts that correspond to both active and inactive I/O contacts on the bottom side of the logic layer.

Example 23. The method of example 22, the package substrate may include I/O signal paths routed between the HBM device and a central processing unit or a graphics processing unit, the I/O signal paths to couple with the first contacts.

Example 24. The method of example 19, the portion and the remaining portion of I/O contacts may be included in a plurality of I/O contacts for a first data channel from among the one or more data channels. The first data channel may access a memory array at a memory device from among the plurality of memory devices, the portion to include half of the plurality of I/O contacts.

Example 25. The method of example 19, the portion of I/O contacts and the remaining portion of I/O contacts may be included in a plurality of I/O contacts for a first data channel and a second data channel from among the one or more data channels. The first data channel may access a first memory array at a memory device from among the plurality of memory devices. The second data channel may access a second memory array at the memory device, the portion to include half of the plurality of I/O contacts for the first and the second data channels.

Example 26. The method of example 25 may also include causing, based on the determined mode of operation, a portion of CA contacts on the bottom side of the logic layer to be active and a remaining portion of the CA contacts to be inactive. The portion of CA contacts may be arranged to receive or transmit CA signals for the first and the second data channels to facilitate access to the plurality of memory devices. The method may also include causing CA signals for the first and the second data channels to be routed through the portion of CA contacts such that a redirection layer below the logic layer enables the high bandwidth memory stack device to connect with a package substrate through a reduced number of CA contacts.

Example 27. The method of example 19, the plurality of memory devices may include dynamic random access memory.

Example 28. An example at least one machine readable medium may include a plurality of instructions that in response to being executed by a system may cause the system to carry out a method according to any one of examples 19 to 27.

Example 29. An example apparatus may include means for performing the methods of any one of examples 19 to 27.

It is emphasized that the Abstract of the Disclosure is provided to comply with 37 C.F.R. Section 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single example for the purpose of streamlining the disclosure. This method of disclosure is not to be interpreted as reflecting an intention that the claimed examples require more features than are expressly recited in each claim. Rather, as the following claims reflect, inventive subject matter lies in less than all features of a single disclosed example. Thus, the following claims are hereby incorporated into the Detailed Description, with each claim standing on its own as a separate example. In the appended claims, the terms "including" and "in which" are used as the plain-English equivalents of the respective terms "comprising" and "wherein," respectively. Moreover, the terms "first," " "second," "third," and so forth, are used merely as labels, and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A processing device comprising:
a processor;
a memory system coupled to the processor and including
    a logic layer having input/output (I/O) contacts on a side of the logic layer including circuitry to execute logic, the logic to:
receive signals from the processor to cause I/O signals to be routed via one or more data channels in the memory system through a portion of the I/O contacts such that a redirection layer below the logic layer enables the memory system to connect with a package substrate through a reduced number of I/O contacts.

2. The memory device of claim 1, further comprising
a plurality of stacked memory dice within the memory system;
a mode register to indicate a mode of operation; and
the logic layer located below the plurality of stacked memory dice, the logic to:
read a bit value of the mode register; and
cause, based on the bit value of the mode register, a portion of input/output (I/O) contacts on a bottom side of the logic layer to be active and a remaining portion of the I/O contacts to be inactive, the portion of I/O contacts arranged to receive or transmit I/O signals for one or more data channels to access at least one memory array maintained on at least one memory die of the plurality of stacked memory dice.

3. The memory device of claim 1, comprising the logic to cause the I/O signals to be routed via the one or more data channels through the portion of I/O contacts at a first transfer rate per second that is twice a second transfer rate per second if the I/O signals were routed via the one or more data channels through both the portion of I/O contacts and the remaining portion of I/O contacts.

4. The memory device of claim 1, comprising the memory device to connect with the package substrate via first contacts having a larger pitch between the first contacts compared to second contacts that correspond to both active and inactive I/O contacts on the bottom side of the logic layer.

5. The memory device of claim 4, comprising the package substrate including I/O signal paths routed between the memory device and a central processing unit or a graphics processing unit, the I/O signal paths to couple with the first contacts.

6. The memory device of claim 1, comprising the portion and the remaining portion of I/O contacts included in a plurality of I/O contacts for a first data channel from among the one or more data channels, wherein the first data channel is configured to access a first memory array maintained on the at least one memory die, the portion to include half of the plurality of I/O contacts.

7. The memory device of claim 1, comprising the portion of I/O contacts and the remaining portion of I/O contacts included in a plurality of I/O contacts for a first data channel and a second data channel from among the one or more data channels, wherein the first data channel is configured to access a first memory array maintained on the at least one memory die and the second data channel is configured access a second memory array maintained on the at least one memory die, the portion to include half of the plurality of I/O contacts for the first and the second data channels.

8. The memory device of claim 7, further comprising the logic to:
cause, based on the bit value of the mode register, a portion of command and address (CA) contacts on the bottom side of the logic layer to be active and a remaining portion of the CA contacts to be inactive, the portion of CA contacts arranged to receive or transmit CA signals for the first and the second data channels to facilitate access to the first and the second memory arrays; and
cause CA signals for the first and the second data channels to be routed through the portion of CA contacts such that a redirection layer below the logic layer enables the memory device to connect with a package substrate through a reduced number of CA contacts.

9. The memory device of claim 1, comprising the plurality of memory dice including dynamic random access memory.

10. A method comprising:
sending signals from a processor to a memory system coupled to the processor and including a logic layer having input/output (I/O) contacts on a side of the logic layer including circuitry to execute logic, and
receiving signals from the processor to cause I/O signals to be routed via one or more data channels in the memory system through a portion of the I/O contacts such that a redirection layer below the logic layer enables the memory system to connect with a package substrate through a reduced number of I/O contacts.

11. The method of claim 10 further comprising:
determining, via a mode register, a mode of operation for a plurality of stacked memory dice stacked above a logic layer in the memory system;
reading a bit value of the mode register; and
causing, based on the bit value of the mode register, a portion of input/output (I/O) contacts on a bottom side of the logic layer to be active and a remaining portion of the I/O contacts to be inactive, the portion of I/O contacts arranged to receive or transmit I/O signals for one or more data channels to access at least one memory array maintained on at least one memory die the plurality of stack memory dice.

12. The method of claim 10, further comprising:
causing the I/O signals to be routed via the one or more data channels through the portion of I/O contacts at a first transfer rate per second that is twice a second transfer rate per second if the I/O signals were routed via the one or more data channels through both the portion of I/O contacts and the remaining portion of I/O contacts.

13. The method of claim 10, comprising the memory device to connect with the package substrate via first contacts having a larger pitch between the first contacts compared to second contacts that correspond to both active and inactive I/O contacts on the bottom side of the logic layer.

14. The method of claim 13, comprising the package substrate including I/O signal paths routed between the memory device and a central processing unit or a graphics processing unit, the I/O signal paths to couple with the first contacts.

15. The method of claim 10, comprising the portion and the remaining portion of I/O contacts included in a plurality of I/O contacts for a first data channel from among the one or more data channels, wherein the first data channel is configured to access a first memory array maintained on the at least one memory die, the portion to include half of the plurality of I/O contacts.

16. The method of claim 10, comprising the portion of I/O contacts and the remaining portion of I/O contacts included in a plurality of I/O contacts for a first data channel and a second data channel from among the one or more data channels, wherein the first data channel is configured to access a first memory array maintained on the at least one memory die and the second data channel is configured to access a second memory array maintained on the at least one memory die, the portion to include half of the plurality of I/O contacts for the first and the second data channels.

17. The method of claim 16, further comprising:
causing, based on the bit value of the mode register, a portion of command and address (CA) contacts on the bottom side of the logic layer to be active and a remaining portion of the CA contacts to be inactive, the portion of CA contacts arranged to receive or transmit CA signals for the first and the second data channels to facilitate access to the first and the second memory arrays; and
causing CA signals for the first and the second data channels to be routed through the portion of CA contacts such that a redirection layer below the logic layer enables the memory device to connect with a package substrate through a reduced number of CA contacts.

18. The method of claim 10, comprising the plurality of memory dice including dynamic random access memory.

* * * * *